(12) United States Patent
Brunner

(10) Patent No.: US 7,135,875 B2
(45) Date of Patent: Nov. 14, 2006

(54) APPARATUS AND METHOD FOR CONTACTING OF TEST OBJECTS

(75) Inventor: Matthias Brunner, Kirchheim-Heimstetten (DE)

(73) Assignee: Applied Materials GmbH, Ismaning (DE)

( * ) Notice: Subject to any disclaimer, the term of this patent is extended or adjusted under 35 U.S.C. 154(b) by 35 days.

(21) Appl. No.: 10/716,102

(22) Filed: Nov. 18, 2003

(65) Prior Publication Data

US 2004/0145383 A1 Jul. 29, 2004

(30) Foreign Application Priority Data

Nov. 18, 2002 (DE) ................ 102 53 717

(51) Int. Cl.
*G01R 31/305* (2006.01)
*G01R 31/28* (2006.01)

(52) U.S. Cl. .................. 324/751; 324/765

(58) Field of Classification Search ............. None
See application file for complete search history.

(56) References Cited

U.S. PATENT DOCUMENTS

| | | | |
|---|---|---|---|
| 4,532,423 A | 7/1985 | Tojo et al. ............ 250/310 |
| 4,761,607 A | 8/1988 | Shiragasawa et al. ... 324/158 R |
| 4,965,515 A | 10/1990 | Karasawa ............. 324/158 R |
| 4,985,676 A | 1/1991 | Karasawa ............. 324/158 R |
| 5,365,034 A * | 11/1994 | Kawamura et al. ..... 219/121.83 |
| 5,521,522 A * | 5/1996 | Abe et al. ............. 324/758 |
| 5,528,158 A | 6/1996 | Sinsheimer et al. ..... 324/758 |
| 5,530,370 A | 6/1996 | Langhof et al. ........ 324/754 |
| 5,621,333 A | 4/1997 | Long et al. ........... 324/762 |
| 5,644,245 A | 7/1997 | Saitoh et al. .......... 324/754 |
| 5,691,764 A | 11/1997 | Takekoshi et al. ...... 348/86 |
| 5,742,173 A | 4/1998 | Nakagomi et al. ...... 324/753 |
| 5,801,545 A | 9/1998 | Takekoshi et al. ...... 324/770 |
| 5,923,180 A | 7/1999 | Botka et al. .......... 327/758 |
| 5,982,190 A | 11/1999 | Toro-Lira ............ 324/770 |
| 6,046,599 A | 4/2000 | Long et al. ........... 324/762 |
| 6,075,245 A | 6/2000 | Toro-Lira |
| 6,198,299 B1 | 3/2001 | Hollman ............. 324/758 |
| 6,288,561 B1 | 9/2001 | Leedy ............... 324/760 |
| 6,297,656 B1 | 10/2001 | Kobayashi et al. ..... 324/758 |
| 6,343,369 B1 | 1/2002 | Saunders et al. ........ 716/4 |
| 6,362,013 B1 | 3/2002 | Yoshimura ........... 438/14 |
| 6,798,231 B1 * | 9/2004 | Iwasaki et al. ........ 324/770 |

FOREIGN PATENT DOCUMENTS

| | | |
|---|---|---|
| DE | 3636316 A1 | 10/1986 |
| EP | 0 402 499 A1 | 12/1990 |
| EP | 1 233 274 A2 | 8/2002 |
| JP | 2001 318116 | 11/2001 |

OTHER PUBLICATIONS

German Search Report, dated Jul. 18, 2003 for DE 102 53 717.8.
German Examination Report, dated Jul. 14, 2003 for DE 102 53 717.8.
Kumada, et al., "Non-Contact Array Testers", Oct. 15, 2002.
European Search Report, dated Apr. 7, 2004, for EP 03026267.9.

* cited by examiner

*Primary Examiner*—Ernest Karlsen
(74) *Attorney, Agent, or Firm*—Patterson & Sheridan, L.L.P.

(57) ABSTRACT

The invention relates to methods for positioning of a substrate 140 and contacting of the test object 301 for testing with a test apparatus with an optical axis and corresponding devices. Thereby, the substrate is put on the holder 130. The substrate is positioned relative to the optical axis. A contact unit 150 is also positioned relative to the optical axis, whereby the contact unit is positioned independent of the positioning activity of the substrate. Thereby, a flexible contacting of test objects on the substrate can be realized.

11 Claims, 11 Drawing Sheets

APPARATUS AND METHOD FOR CONTACTING OF TEST OBJECTS

CROSS-REFERENCE TO RELATED APPLICATIONS

This application claims benefit of German patent application serial number 102 53 717.8 filed on Nov. 18, 2002.

BACKGROUND OF THE INVENTION

Field of the Invention

The invention relates to the testing of large areas. Thereby, particularly tests with a corpuscular beam are used as a testing method. In particular, the present invention relates to the contacting of test objects. Specifically, the present invention relates to a method for positioning and contacting a substrate, a method for the testing of a substrate, and an apparatus for contacting at least one test object for the test and to a test system.

With increasing demand on display elements without picture tubes, the standards for liquid crystal displays (LCD) and other display elements, in which control elements, for example thin film transistors (TFT), are used increase. These display elements have pixels arranged in a matrix.

Yet, also in other fields an increasing amount of elements has to be tested. This can be, for example, microelectronic and/or micromechanic elements. These elements are for example thin film transistors, connection networks of a chip, transistors, electron emitters of an emitter array, the electrodes for pixels of a display, micromechanic mirrors of an array and other elements, which distinguish themselves in particular by being present as a plurality of elements (100,000 a to several 1,000,000), whereby each element is electrically controllable.

In order to obtain, for example, a good image quality of a display element, only a few of the several million pixels are allowed to be defective. For guaranteeing a cost efficient production it is therefore important, most notably for the display elements continuously increasing in size, to provide high-capacity in situ test methods. Such a test method is for example disclosed in document EP 523594. Within this test method, the individual pixels are tested with a corpuscular beam. The corpuscular beam can either be used for detecting charges applied via a supply line and/or applying charges on a pixel electrode.

For such test methods contact units are employed, which, on the one hand, allow for a signal transfer to external devices and, on the other hand, admit a scanning with an electron beam. Thereby, according to the state of the art, different solutions exist.

If displays are tested, it is possible to arrange a frame around the area of the display which provides electrical contacts to the display. On one substrate there are generally several displays arranged. Because in view of the limited measurement range of an electron beam system only one display each can be tested, for the test of a further display that contact units is lifted, the substrate is displaced and the contact unit is set on the next display. However, using such an arrangement, only displays can be tested whose entire surface can be reached by the scanning of the corpuscular beam.

Further, there are contact frames that contact all displays of a glass substrate at the same time. Such a contact frame is displaced with a substrate, if other displays are to be tested.

A disadvantage of such contact frames for the entire substrate is the necessity to exchange the entire contact frame in the event of varying display sizes. For this reason the system must be vented in the case of varying batches, which reduces the productivity. Further, it is necessary to store the contact frames for the varying display types and display sizes in order to be applied when demanded.

The object of the invention is to at least partly solve the problems of the state of the art. Particularly, the possibility should be given to test during a test different test objects with different dimensions of test objects with one apparatus.

Thereby, test objects in the context of the present invention are for example displays, a group of displays, arrays of other microelectronic or micromechanic elements, as well as individual circuits, which are for example tested on short-circuits and missing contacts between areas of the circuit.

SUMMARY OF THE INVENTION

Preferred embodiments and specific aspects of the invention are evident from the dependent claims.

According to one aspect, the object of the present invention is solved by a method for positioning of a contact unit during testing with a test apparatus which has an optical axis. Therefore, a substrate having several test objects is positioned on a sample support, that is, a substrate holder. The substrate is displaced relative to the optical axis, so that an area of the test object lies in the measurement range of the test apparatus. A contact unit for contacting the test objects is positioned, whereby the positioning of the contact unit is at least partially not coupled to the positioning of the substrate. The positioning of the contact unit is suitable for bringing the contact unit in contact with a contact arrangement or several contact arrangements of the test object.

The object is further solved according to a further aspect of the invention by a method for testing a substrate with several test objects with a test apparatus. The substrate is placed on a sample support. A contact arrangement of a first test object of the test objects on the substrate is contacted with a contact unit. The holder and thereby the substrate is positioned in order that a first area of the first test object can be measured in the test range of the test apparatus. Thereupon, the first area of the first test object is tested. The holder and thereby the substrate are newly positioned in order to test at least a further area of the test object in the test range of the test apparatus. The contact unit is also positioned so that the position relative to the substrate is essentially not changed. The at least further area of the test object is tested. The substrate is again newly positioned in order to test an area of a second test object. The contact unit is displaced relative to the substrate for the test of the area of the second test object.

Contacting of differently formed test objects is possible with the above described aspects of the present invention without the necessity of an exchange of the contact unit. Further, it is possible to test test objects with the test apparatus, the size of which exceeds the test range of the test apparatus. In this context, the components for generating the measurement signals are understood as the test apparatus. These are: a source for the generation of a primary corpuscular beam, beam shaping- and beam-deflection components for guiding the beam on a surface, which is used for obtaining the measurement signal, components for guiding and/or imaging of the measurement signal on a detection unit, and the detecting unit.

Independent of the fact when comparing to the state of the art the exchange of the contact unit should be avoided, however, and occasional exchange can be beneficial for maintenance or the like. The contact unit is typically an exchangeable unit.

Within the scope of the above-mentioned aspects, it is particularly preferred if the positioning of the contact unit takes place with a drive assigned to the contact unit. Thereby, the contact unit can fast and flexibly be moved from one position to the next position. This increases the test velocity of the entire substrate and, thereby, the throughput of the test system.

According to a further aspect, the inventive object is solved by an apparatus for contacting, which is used for test system. This system includes a sample support with a positioning unit. The positioning unit has, in both directions perpendicular to the optical axis of the test apparatus, a displacement range. The contact unit also has, in both directions perpendicular to the optical axis of the test apparatus, a displacement range. Thereby, at least one displacement range of the contact unit is smaller than the corresponding displacement range of the sample support.

According to an aspect of the invention an apparatus for contacting is disclosed. This includes a holder for a substrate and a corresponding displacing unit. Further, there exists an also displaceable contact unit, which has at least in one direction, perpendicular to an optical axis of a corpuscular beam tester, a smaller dimension than the dimension of the holder in this direction.

A principal aspect of the invention is an apparatus for contacting. This includes a holder for a substrate and a corresponding displacement unit. Further, there exists an also displaceable contact unit, which has at least in one direction perpendicular to an optical axis of a corpuscular beam tester at maximum half of the dimension of the holder in this direction.

Thereby, the holder can be a substrate table on arrangement of rollers on which the substrate is shelved. The holder is a substrate holding unit. That is, the substrate lies on the holder or the holder supports the substrate respectively.

According to a further aspect of the invention, an apparatus for contacting is disclosed. This includes the holder for a substrate and a corresponding displacing unit. Further, there exists an also displaceable contact unit which is at least in one direction, perpendicular to the optical axis of a corpuscular beam tester, smaller than the substrate or has at maximum half of the dimension of the substrate in this direction.

Apparatuses, which can be improved by the present invention, often have a holder larger than the substrate. In the event that the substrate should be large than the holder, the above-mentioned relative sizes between the contact unit and the holder refer at least to the substrate to be inspected. This means, that the relative sizes are given for the contact unit relative to the substrate.

Thereby, it is particularly preferred if the contact unit has, in both directions perpendicular to the optical axis of a corpuscular beam tester, at maximum half of the dimension of the holder in this direction.

The present invention can also be phrased as follows. According to one aspect of the invention, the object is solved by an apparatus for contacting within a test system. The test system includes a holder, which is displaceable relative to the optical axis of the test apparatus, and a contact unit, which is also displaceable relative to the optical axis. The contact unit is during the test of the substrate also displaceable with respect to the substrate.

With regard to this aspect, it is preferred if the contact unit is displaceable during the testing of the test objects of a substrate by at least 10 cm, especially preferred by at least 25 cm.

According to a further aspect, the inventive object is solved by a test system. The test system includes a corpuscular beam column, a test chamber, and an apparatus for contacting of at least one test object of a substrate according to one of the above-mentioned aspects.

Thereby, it is preferred if the test chamber can be evacuated. Further, it is preferred if the corpuscular beam column is an electron beam column, whereby particularly an emitter, deflection units and beam shaping optics are included in the column.

According to the present invention, the corpuscular beam can be formed by photons, that is a light optical test of the elements of the test objects on the substrate is conducted.

Further, in order to save the space required for a displacement of the glass substrate, it is possible not to move the glass substrate and a contact unit relative to the optical axis of the test apparatus, but to keep the glass substrate rested. In such a case, on the one hand, the optical axis of the test apparatus is moved relative to the glass substrate. Further, on the other hand, the contact unit is moved relative to the glass substrate and the contact unit and the optical axis of the test apparatus are moved relative to each other.

The invention also relates to apparatuses with features that are necessary to conduct the described methods. Further, the invention relates to methods that are characterized by the usage of the described apparatuses.

BRIEF DESCRIPTION OF THE DRAWINGS

Embodiments of the invention are described in the drawings and are exemplarily described in more detail in the following.

Therein.

DETAILED DESCRIPTION OF THE PREFERRED EMBODIMENT

The present invention can be used for a variety of test methods. For simplicity, the present invention is in the following at first described by the testing of displays with an electron beam.

Figure 9:
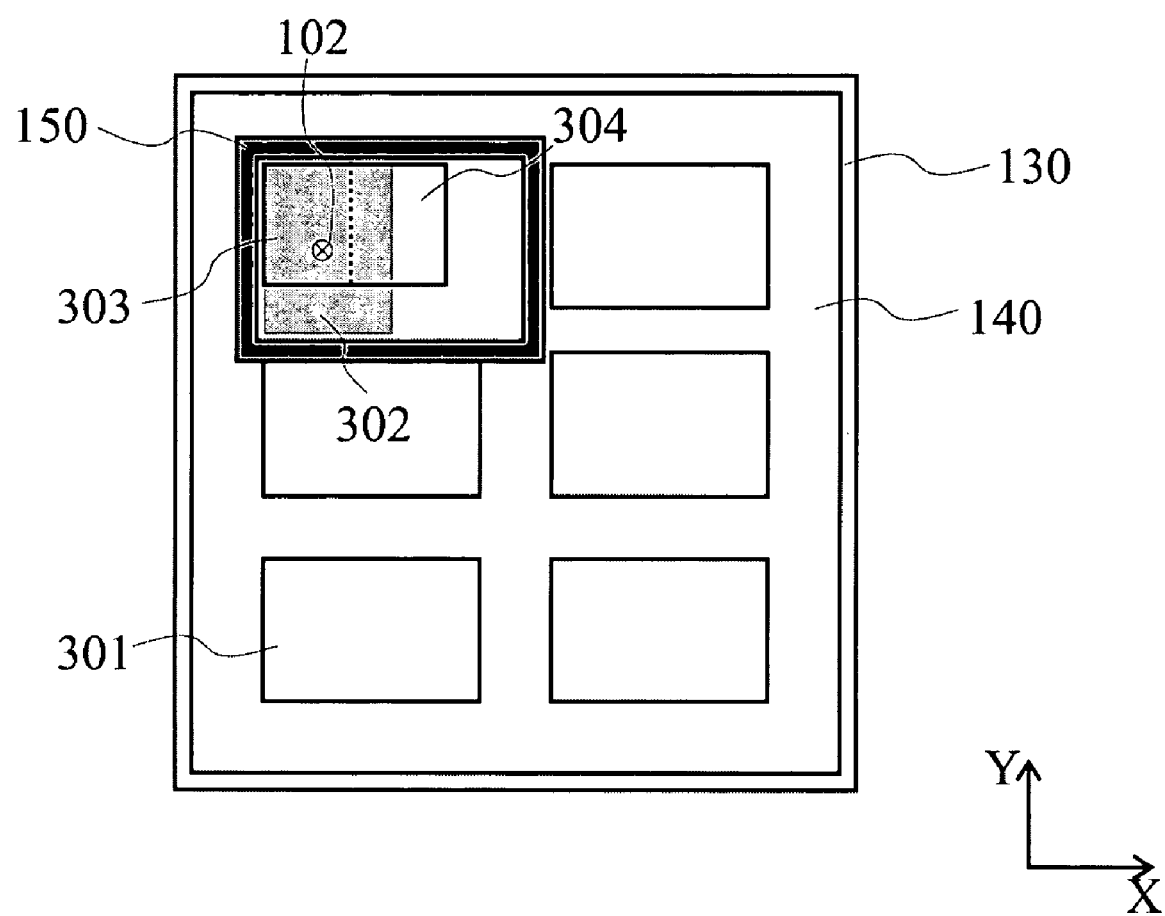
FIG. 9 shows a schematic view of an example for illustration of the used terms.

Thereby, at first, the terms used are illustrated with respect to FIG. 9. FIG. 9 shows a top view onto a glass substrate 140 on a sample support 130. On the substrate, the six displays 301 are fabricated. Thereby, as an example, the displays are distributed on the glass substrate with uniform distances. The glass substrate is provided in a test chamber (see FIG. 1). This means that during an inspection of the displays, the electron beam column is located above the glass substrate that is shown in FIG. 9. For clarification, the optical axis 102 of the electron beam is shown in FIG. 9.

For the testing of a display, the electron beam is scanned over the glass substrate with deflectors. Thereby, an area 302 is detected by the electron beam. This area is, in the following, denoted as test range 302 and is indicated gray. Thereby, the test range 302 is the area which can maximally or in a reasonable manner be tested by the electron beam. This means that in an area of the sample external to the test range 302, no measurement results can be gathered by the test method. The test range is, as a result, independent of the substrate to be inspected. It is rather a characteristic of the test apparatus, thus, the electron beam test device.

FIG. 9 shows the display 301 that is larger than the test range 302 of the test apparatus. Thus, the display can not be tested by the test apparatus without displacing the glass substrate 140 with the displays relative to the optical axis 102. For this reason, the displays in FIG. 9 have to be divided into several areas, which are tested one after the other. These areas are the first area 303 and the second area 304. Consequently, during the test of the first display (top left), the glass substrate is displaced in order to position the first area 303 within the test range 302 of the test apparatus. Thereafter, the glass substrate is again displaced with respect to the optical axis 102 in order to position the second area 304 within the test range of the test apparatus. A displacement relative to the optical axis 102 is thereby similar to a displacement relative to the test range 302.

Generally, displays have to be electrically contacted for test methods in order to test the functionality of the displays. Therefore, a contact unit 150 is placed on the glass substrate. This contact unit provides electrical contacts to the displays. Thereby, the displays can be electrically connected to external devices necessary for the test.

Figure 7:
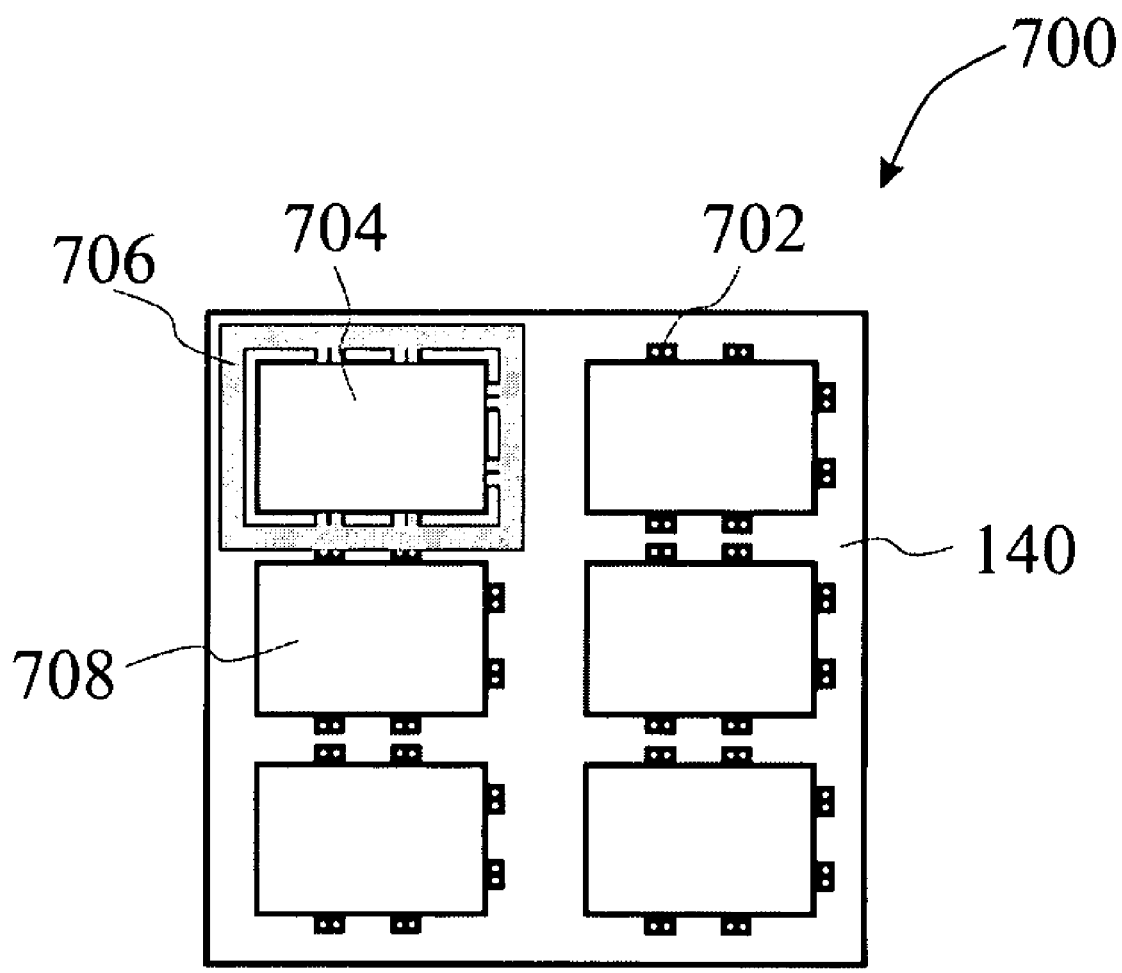
FIG. 7 shows a schematic side view of an embodiment the invention is based upon.

With reference to FIG. 7 and the FIGS. 8a to 8c, next, the ideas forming the basis of the invention will be described.

The assembly 700 in FIG. 7 shows a top view of the glass substrate 140. There are a several displays 708 to be tested or circuits for displays 708 to be tested on the glass substrate. The assembly 700 is inserted in a test system for testing. In the test apparatus, the displays are inspected with an electron beam. Thereby, the electron beam is scanned over an area of the substrate. Thereby, measurements results can only be gathered within the test range 704 of the test apparatus.

The entire glass substrate is too large to be tested by an electron beam without displacement. For conducting a measurement of an area of a display, the area being within the test range, the display 708 is contacted with a contact unit 706 via the contact arrangement 702. Thereby, measurement signals as well as other externally provided test signals can be transmitted between the display under test and a measurement electronic.

Within FIG. 7, the displays have a dimension that is smaller or equal to the test range 704. Firstly, the glass substrate is positioned so that a first display is provided within the area 704 of the test apparatus, which can be used for the measurement with the electron beam. For the assembly 700, a contact unit 706 is put on the glass substrate. Thereby, contact pins of the contact unit are contacted with contact assembly 702 designed therefore, which are provided on the glass substrate for contacting each displays 708. External signals can be provided to the display via these contacts. If required for the measurement method, signals of the displays can also be measured via these contacts.

For the testing of all displays on the glass substrate 140, firstly, a first display is contacted. Afterwards, this display is inspected with the electron beam test method. Then, the contact unit 706 is lifted and the glass substrate 140 is displaced. Thereby, a further display is positioned in the test range of the test apparatus. The contact unit 706 is contacted with the further display in order to inspect this display. In doing so, all displays on the substrate are inspected. However, with this embodiment, only displays can be inspected whose dimensions are within the range that can be inspected with the electron beam.

Figure 8A:
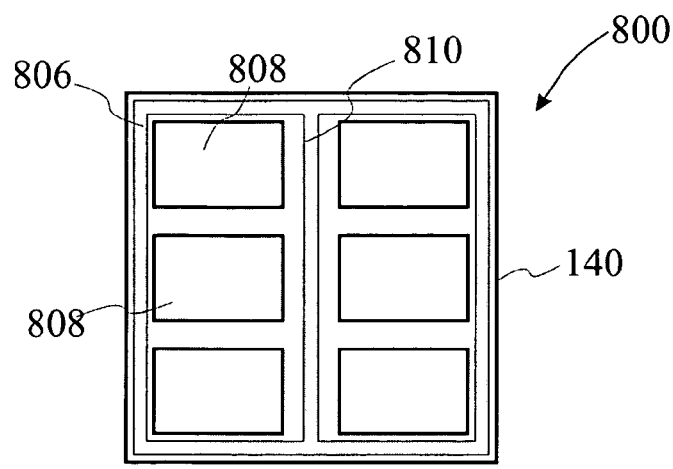
FIGS. 8a to 8c show schematic views variations of further embodiments the invention is based upon.
Figure 8B:
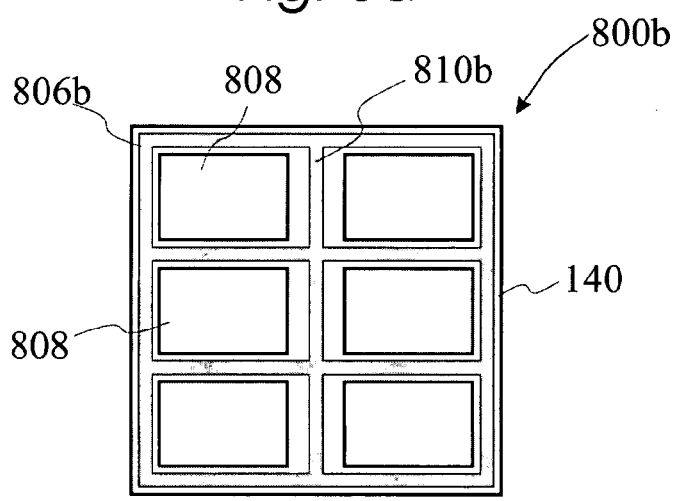
Figure 8C:
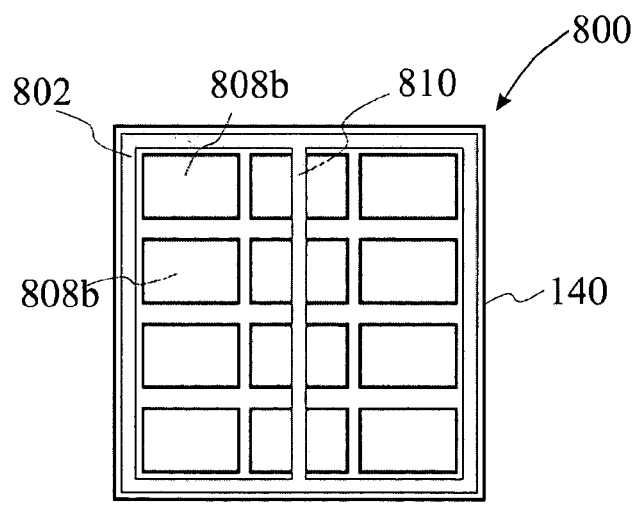

FIGS. 8a to 8c show a further assembly 800 or 800b, respectively. All displays 808 on the glass substrate 140 are contacted with the contact unit 806 or 806b, respectively, for the assemblies 800 and 800b. If the glass substrate is displaced during the testing of different areas of the glass substrate 140, the contact unit that rests on the glass substrate is carried along.

FIG. 8a shows the glass substrate 140. The contact unit 806 contacts all displays 108 for realization of the test. In order to be able to provide all displays 808 with signals or being able to receive signals from all displays, respectively, the contact unit 806 has a bond bridge 810.

The assembly 800b in FIG. 8b is comparable to assembly 800. The contact unit 806b simply includes a grid-like bond bridge 810b.

FIG. 8c again shows the assembly 800. Contrary to FIG. 8a, in here, the displays 808b have different dimensions.

As realized by comparing FIG. 8a with FIG. 8c, the bridge 810 covers a part of the display 808b to be tested; therefore, a reasonable test is not possible. Thus, it is required for the inspection of the displays 808b to choose a different shape for the contact unit. In order to realize this in practice, the test apparatus is vented, the contact unit 806 or 806b, respectively, is removed, a contact unit suitable for the new displays 808b is inserted in the system, and the system is newly evacuated.

Since the venting and the evacuating involves large disadvantages in the course of production, it is desirable to reduce such problems with the present invention.

In the following, embodiments and preferred aspects of the present invention are illustrated with respect to FIGS. 1 to 6.

Figure 1:
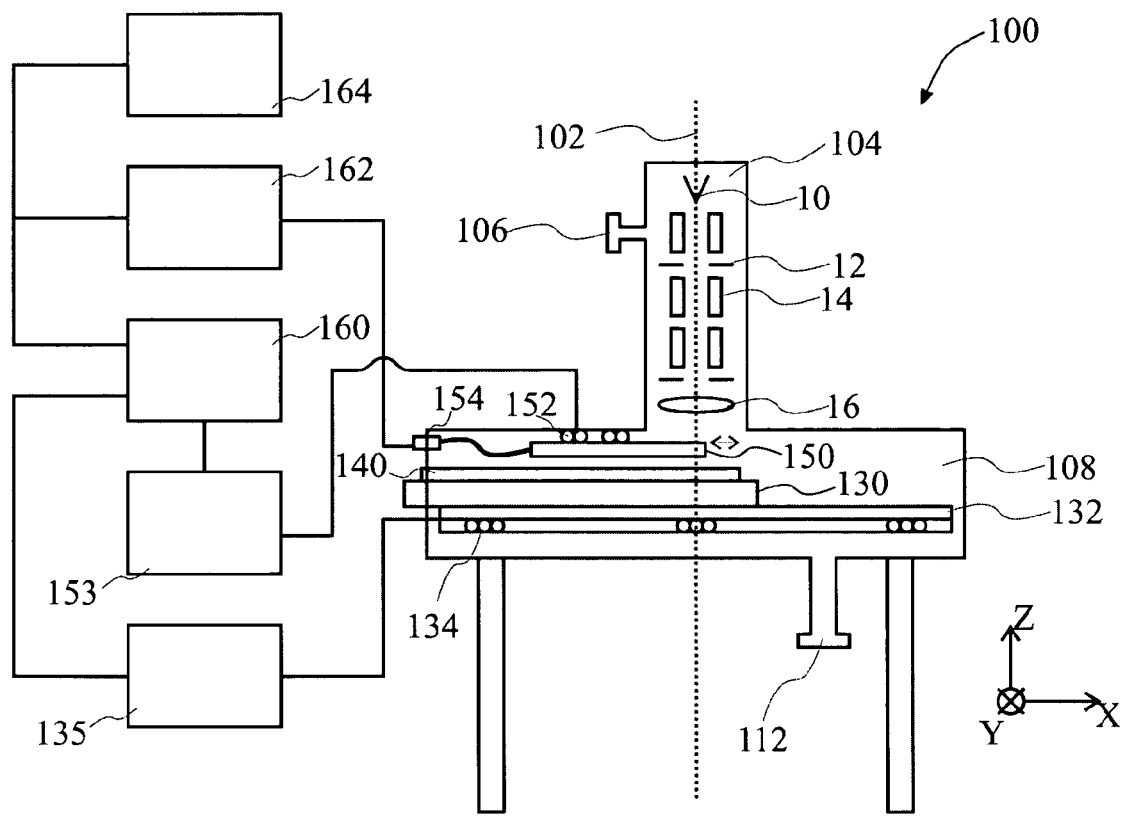
FIG. 1 shows a schematic side view of a test system according to the present invention.

FIG. 1 shows a test system 100. The test system inspects test objects, for example displays provided on a glass substrate 140 or another substrate, by means of corpuscular beams. The test system includes, as one part, a test apparatus for example in terms of the column 104. Within the column the corpuscular beam is generated in the emitter 10.

With regard to this invention, corpuscular beam is to be understood as a beam of charged particles (particle beam), such as for example an electron or ion-beam, or a laser beam. This means that the term corpuscular beam is to be understood as a laser beam, in which the corpuscles or photons, as well as a particle beam, in which the corpuscles are ions, atoms, electrons or other particles. As an example, in the following, it is referred to an electron beam.

Further, FIG. 1 shows apertures 12, deflectors 14 and lens 16. These serve, inter alia, for imaging of the electron beam along the optical axis 102. The displacing units 132 and 134 are provided in the test chamber 108. The sample support 130 can be displaced in x-direction and y-direction with the displacing units. In FIG. 1, this is realized by two displacing units that are displaceable with respect to each other. Thus, on displacement of the displacing unit 134 in x-direction, the displacing unit 132 as well as the holder with the substrate is displaced in x-direction. Independent thereof, the displacing unit 132 is controlled for a displacement of the sample support 130 with the glass substrate 140 in y-direction. Thereby, the sample support with the substrate can be moved in the x-y-plane.

The test chamber can be evacuated through the vacuum flange 112. Holder or sample support 130, respectively, are moved with the displacing units. The glass substrate 140 is provided on the holder during the measurement. Further, the contact unit 150 with a drive 152 is provided within the test chamber 108. During the measurement, a display on the substrate is contacted with the contact unit in order to realize an electrical contact of the display with the test system.

The drive 152 serves for an independent moving of the contact unit relative to the optical axis 102 of the test apparatus and relative to the sample support 130. A signal connection of the contact unit 150 takes place with the contact connection 154. Further, within FIG. 1, the control and operation units 135, 153, 160, 162, and 164 are shown, which are illustrated in more detail with respect to the usage of the test system 100.

Referring to FIG. 1, in the following, the functionality of the test system is described. The electron beam generated by emitter 10 is guided via elements like apertures 12, deflectors 14 for beam positioning and for scanning, as well as lenses 16 in the test chamber 108. Additionally, the beam is formed by the optical elements.

For the test methods, the electron beam is directed on an element of the display on the substrate. Thereby, a charging of areas of the element to be tested can be achieved. Further, it is also possible to measure emitted secondary particles with a detector (not shown). By the measurement of the secondary electrons, it is possible to measure the potential distributions on the displays; as well as, topologies or material compositions can be determined with other detection methods.

An evacuation of the column 104 can be conducted through the vacuum flange 106. Further connections (not shown) serve for connection with external control devices. These control devices can be computers, control units, and central control systems with a user interface.

A displacing unit (132+134) is provided in the test chamber 108. This is for example formed by two linear displacing units. Thereby, a displacement in x-direction is conducted with the displacing unit 134 and a displacement in y-direction is conducted with displacement unit 132. The displacing units are connected with the control unit 135. The control unit controls the positioning of the holder 130 (sample support) in the x-y-plane.

The holder 130 for holding of the substrate 140, that is the sample support, is moved relative to the optical axis 102 of the electron beam column with the displacing unit (132+134).

During the test of displays on the substrate, the displays either have to be fed with external signals, or signals, which are generated within the displays, have to be measured and applied to an evaluation unit. Therefore, the displays are electrically contacted. For this, the contact unit 150 is used. The contact unit provides with the contact pins an electric contact to the contact assembly 200 (see FIG. 2). The contact assembly 200 can either serve for contacting of one display or for contacting of several displays.

Figure 2:
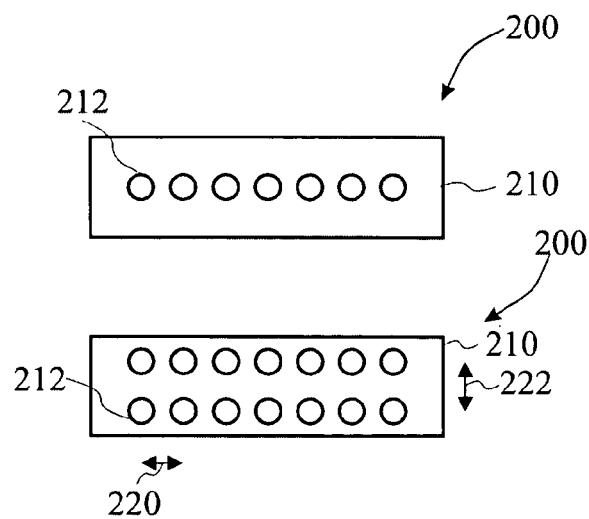
FIG. 2 shows a schematic view of two embodiments of a contact assembly on a test object preferred according to the present invention.

FIG. 2 shows two examples for a contact assembly 200. The contact assemblies include individual contact pads 212. These are arranged on an area 210. The distances between the contact pads are denoted 220 and 222 within FIG. 2.

The contact assembly 200 or several of the contact assemblies 200 are provided together with the display on the substrate. The control lines or measurement lines of the displays are connected via feed lines with the pads 212 of the contact assembly. The pads have a standardized distance in x-direction 220 and a standardized distance in direction 222. Through this, an automated contacting is possible. The two exemplarily shown embodiments differ with respect to the number and arrangement of the contact pads. For contacting of the contact unit with a display, contact pins of the contact unit are guided on the contact pads of the contact assembly 200. Thereby, the individual contact pins for a standardized contact assembly have preferably a fixed distance with respect to each other.

The contact pins of the contact unit are not moved relative to each other for contacting of the contact paths of the contact assembly. This applies to essentially all contact pins relative to each other. Here, essentially is to be understood as at least 90% of the contact pins, preferably as 100% of the contact pins.

Independent of exemplarily embodiments, it is an advantage for the present invention if the contact areas 200 have an assembly which is identical for different types of displays. By means of the present invention, it is possible to test a variety of different displays with one contact unit. Therefore, however, it is preferred if the contact assembly is standardized in order to reduce or avoid the necessity of an adaptation to the geometrical arrangement of the pads 212. Thus, without the existence of a limitation with respect to the flexibility of the test system, the contact pins of the contact unit also can have a fixed geometric arrangement with respect to each other.

For contacting of the contact unit 150 (see FIG. 1) with the contact assembly, the contact unit is moved from above onto the display or the substrate, respectively. In order to ease an adjustment of the contact unit with respect to the contact pads 212, it is advantageous if the contact unit and the substrate are displaceable in x-direction and y-direction by a contact displacement range. Thereby, in each direction, the contact displacement range has the dimension of the distances of the contact pads 220 or 222, respectively.

In FIG. 1, the signal transmittal takes place via the contact unit 150 to a display on a substrate 140 via the contact connection 154. The signals are made available via a control unit 162. With such a unit, if need be, also signals of the display can be measured, which are transmitted with the contact unit.

In order to allow a testing with the electron beam, it is further possible to generate a vacuum in the test chamber 108. The vacuum flange 112 serves therefore. An evacuation of the test chamber is conducted during the test to a pressure of maximum $1*10^{-2}$ mbar, preferably to a pressure of maximum $1*10^{-4}$ mbar. Furthermore, other flanges (not shown) exist, which allow the connection to control units, control computers 164, external communication means, or the like.

In the following, the test method with the test system 100 is described by means of an electron beam, without limiting the invention thereto. A possible test method is to charge electrodes of, for example, pixels of a display on a potential via input leads. This potential or the variation thereof in time, respectively, can be measured with a corpuscular beam. Thereby, it is possible to detect defects such as short-circuits or missing contacts, as well as to determine parasitic elements and the amplitude thereof.

In another method, the electrodes of the pixels are charged via a corpuscular beam and the resulting potentials are also measured with a corpuscular beam. The starting conditions and boundary conditions are arranged with the control of the input leads.

In the further method, the electrodes of the pixels are charged via a corpuscular beam and the resulting current in the input leads is measured.

In the following, the principle of the present invention is illustrated exemplarily with regard to FIGS. 3a and 3b.

Figure 3A:
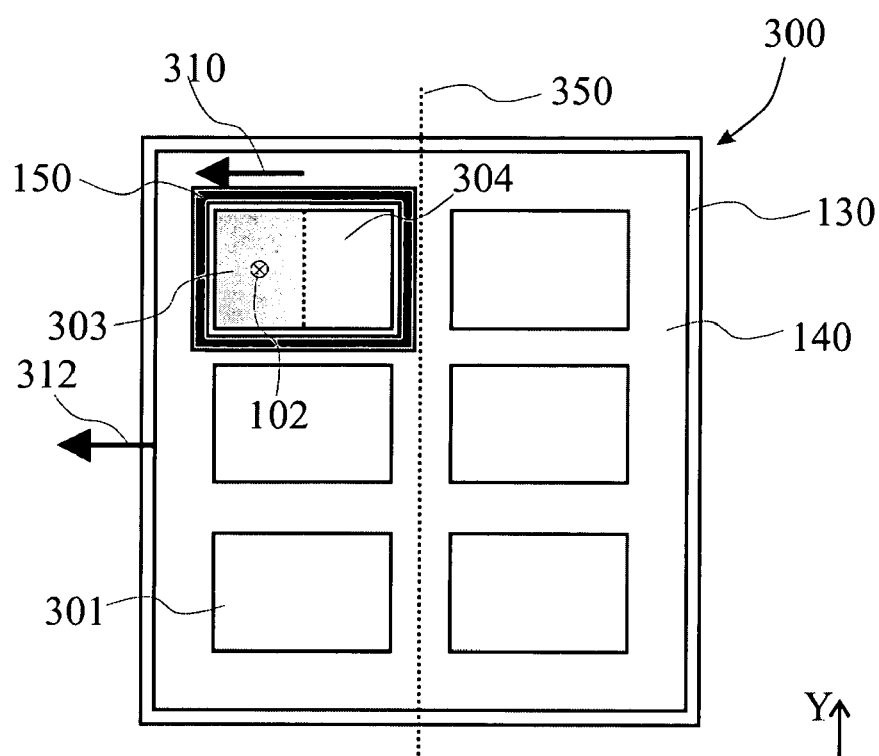
FIGS. 3a to 3d show schematic top views on a substrate with several test objects on a holder and the usage of the contact unit according to the present invention.
Figure 3B:
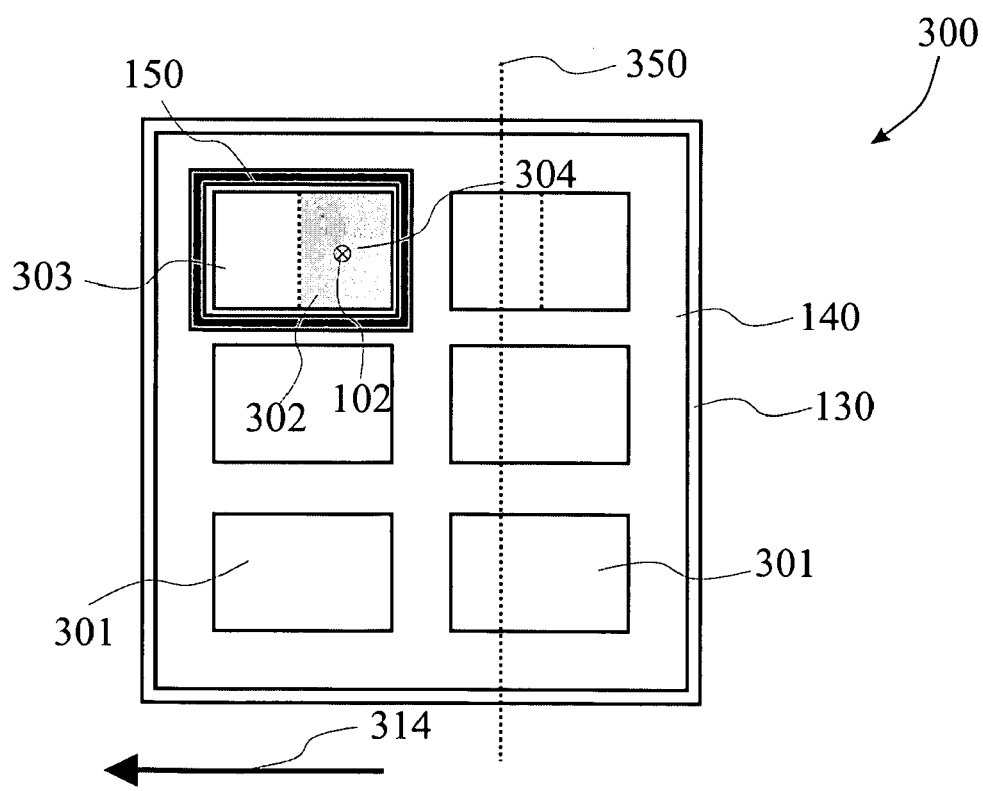

Assembly 300 in FIGS. 3a and 3b show, in a top view, a glass substrate 140, which is located on a sample support 130. Displays 301 or circuits of a display 301, which are to be tested in the apparatus, are provided on the glass substrate. FIGS. 3a and 3b show the same assembly, whereby the glass substrate is moved relative to the indicated guide 350.

Further, FIGS. 3a and 3b show a contact unit 150. The contact unit has the shape of a frame. The frame has a size sufficient not to cover an area of the display to be tested. The test range 302, which can be tested with the electron beam, is indicated gray within FIG. 3. The test range gives the area which can be detected with the test apparatus. External of the test range no measurements can be conducted with the electron beam. Within the test range, the electron beam measures by deflecting the electron beam with a scanning unit. Thereby, the electron beam is deflected in x-direction and y-direction with a scanning unit, so that the test range 302 can be recorded sequentially with the electron beam. Alternatively, it is possible to deflect the electron beam only in one direction and to realize an expansion of the test range in another direction by moving of the substrate.

The displays 301 to be tested are larger than the test range 302 of the test apparatus. Thus, several areas of the display have to be inspected apart from each other. For this reason, the displays are partitioned in a first area 303 and a second area 304. In the embodiment shown in FIG. 3, the areas 303 and 304 correspond to a half of a display. Further, the size of the test range is similar to the size of the first area 303 and the second area 304 of the displays 301. This accordance is accidental and not relevant for the invention.

During the method according to the present invention, a glass substrate 140 as well as the contact unit 150 are displaced. These displacements, which are conducted within the method described with respect to FIG. 3, are indicated by arrows. Within FIG. 3, the displacement of the sample support 130 with the substrate 140 in negative x-direction is denoted by arrow 312. The analogous displacement of the contact unit in negative x-direction is denoted by the arrow 310. A further displacement (transit from FIG. 3b to FIG. 3c) is denoted by 314.

For the inspection of the display, a contacting of the contact assemblies with the contact unit 350 is necessary. Within FIG. 3, the contact unit has the shape of a frame. Advantageously, this frame is sufficiently large in order not to cover any area of the display 301.

During the test method, firstly the first area 303 of a display, which is positioned within the test range 302, is tested. This corresponds to a relative arrangement of the glass substrate 140 and the contact unit 150 to the optical axis 102 as indicated in FIG. 3a. The optical axis 102 and the test range 302 do not move relative to each other (during any of the method steps). The test range 302 results from a deflection of the electron beam from the optical axis 102. Thereby, the size of the test range 302 is for example limited by a maximum deflection of the electron beam from the optical axis 102.

After the testing of the area 303 of the display, the substrate is displaced by the distance 312 in negative x-direction. As can be seen in FIG. 3b, thereby, the second area 304 of the display 301 is positioned in the test range 302 of the test apparatus. Thus, the second area 304 of the display can be tested. A contacting by the contact unit is also necessary for the test of the second area 304 of the displays 301. Therefore, the contact unit is also displaced. The displacement 310 in negative x-direction is thereby essentially identical to the displacement 312 of the substrate. Thereby, the contact unit 150 is carried along with the substrate (displacement 312) so that a contacting is present during the entire time.

After the displacement of the glass substrate 140 and the contact unit 150, the situation shown in FIG. 3b is given. The second area 304 of the first display can now be tested. For testing all displays 301 on the substrate 140, the substrate 140 has to be displaced again relative to the optical axis 301 (and thereby also to the test range 302). This displacement of the substrate is indicated by arrow 314. Afterwards, the situation shown in FIG. 3c is given.

Figure 3C:
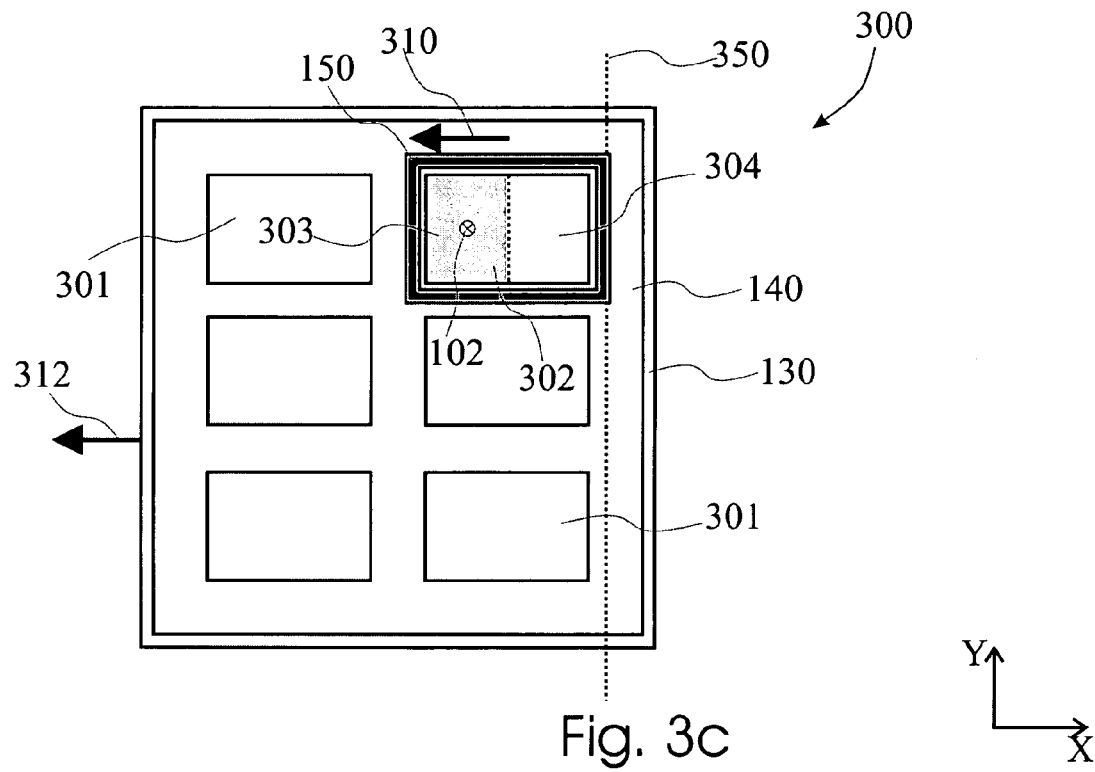
Figure 3D:
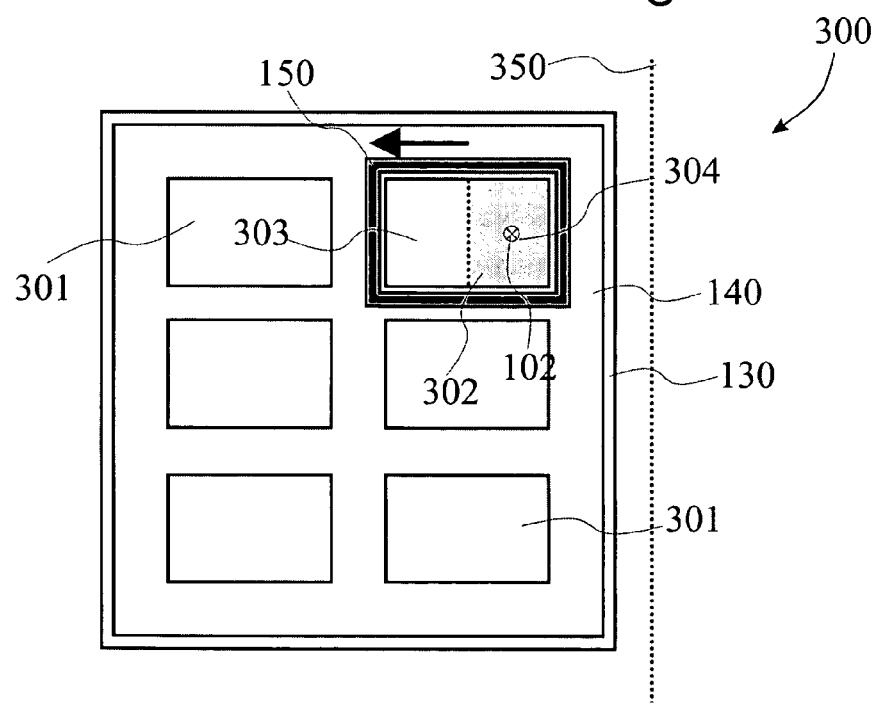

The transit from FIG. 3b to FIG. 3c clarifies the steps for the testing of a further display. Firstly, the contact unit 150 is lifted. The substrate is displaced relative to the contact unit (see arrow 314), whereby the contact unit is positioned above a further display. Afterwards, the contact unit is contacted with the further display. The displacement of the substrate relative to the test range 302 or to an optical axis of an electron beam, respectively, is, within FIG. 3, additionally illustrated by the guide 350.

For the second display to be tested in FIG. 3b a test method is applied, which is conducted analogously to the method described in FIG. 3a. At first, a first area 303 of the second display 301 is positioned in the test range 302 of the electron beam test apparatus. One or several test methods can be applied to the first area 303 of the second displays 301 by means of the contact of the display with the contact unit 150. Afterwards, analogously to the displacements 310 and 312 (FIG. 3a to FIG. 3b), the glass substrate 140 as well as the contact unit 150 are displaced also for the second display. These two displacements result in the situation shown in FIG. 3d. Thereby, the second area 304 of the second display can also be tested using the contact unit 150.

In order to swap for the test of a display 301 from the first area 303 to the second area 304, as described above, the glass substrate has been moved in negative x-direction (see 312) as well as the contact unit has been moved essentially by the same amount in the same direction.

There are several possibilities to realize this parallel displacement. On the one hand, the contact unit 150 can be carried along with the substrate 140. Carried along in this context means that during the contacting of the contact unit with the contact assembly of the display 301, also a mechanical contact is established so that, during the movement 312 of the substrate, the contact unit is moved by the substrate.

On the other hand, it is possible that the contact unit 150 has its own drive 152 (see FIG. 1). Thereby, the contact unit can be positioned autonomously and independently from the substrate. Thus, it is possible that the contact unit 150 follows the movement of the substrate.

Thereby, the substrate 140 and the contacting can be displaced synchronously, whereby the synchronization unit 160 is used. A displacement of the substrate and the contact unit can thus be realized without disconnecting the electrical contact. By means of the own drive of the contact unit, it is also possible to lift the contact unit and to displace the contact unit detached from the substrate. In this case, it is newly put onto.

The embodiment described with respect to FIGS. 3*a* and 3*b*, can generally be described as the following inventive aspect.

The above described inventive method and inventive contact unit was exemplarily described for displays. The method can also be used for testing of other test objects. Test objects are to be understood within the present invention as for example displays, a group of displays, arrays of other microelectronic or micromechanic elements, as well as individual circuits that are for example tested with regard to short-circuits or missing contacts between areas of the circuits.

The present invention allows the test of test objects having different sizes with the same contact unit. Thereby, the contact unit can be positioned relative to the optical axis of a test apparatus and relative to a test object to be tested.

The test objects 301 have been described with regard to the embodiment of FIGS. 3*a* and 3*b* as a display 301. However, a test object can also be a group of displays and other devices that are tested with comparable methods.

The present invention is particularly advantageous for test methods in which only a limited area of the test object can be tested without movement of the substrate with the test objects. This means within the example of FIG. 3 that the area of the test object (display 301) to be tested is larger than the test range 302.

Nowadays, an area of above 20 cm×20 cm can be tested by testing of displays with corpuscular beams. Nowadays, flat-panel displays already have a size of the image diagonal of 17", 19" or larger. During production, several flat-panel displays are fabricated on one glass substrate. The dimensions of the glass substrate in one or in both directions can be about 1500 mm or larger.

According to this, the inventive methods or a test systems are preferably used for test ranges of above 50 mm×50 mm, especially preferably for test ranges of above 200 mm×200 mm. This holds independently of specific embodiments.

Further, independent of specific embodiments, it is preferred if the test systems and methods according to the present invention inspect test objects with a dimension in one or both directions of at least 200 mm, especially preferred of at least 400 mm.

Further, it is generally preferred for the present invention if it is applied for test methods and apparatuses for substrates with a dimension in one or in both directions of at least 700 mm, especially preferred of at least 1200 mm.

Substrate displacements and contact unit displacements that can be realized are preferably at least 50 mm, especially preferably at least 300 mm. In particular, it is preferred if the range of the substrate displacement is larger than the range of the contact unit displacement and is at least 700 mm. This holds for all embodiments which are mentioned exemplarily for clarification of the present invention.

Independent of specific embodiments, it is preferred if the contact unit 150 has its own drive 152 (see FIG. 1) and, thereby, the contact unit can be positioned autonomously and independently from the substrate. In this case it is possible that the contact unit 150 tracks the movement of the substrate.

The tracking can be realized by synchronizing the movement of the substrate and the contact unit. A displacement of the substrate and the contact unit can thus take place without disconnecting the electrical contact. By means of the drive of the contact unit, it is also possible to lift the contact unit and to move it detached from the substrate.

Compared to the principle described with respect to FIG. 7, the present invention has the advantage that test objects 301 can be measured, which are larger than the test range 302 that is predetermined by the test method. This is achieved by the displaceability of the contact unit.

Advantages as compared to the principle described with respect to FIGS. 8*a* to 8*c*, are illustrated in the following with respect to FIG. 4.

Figure 4:
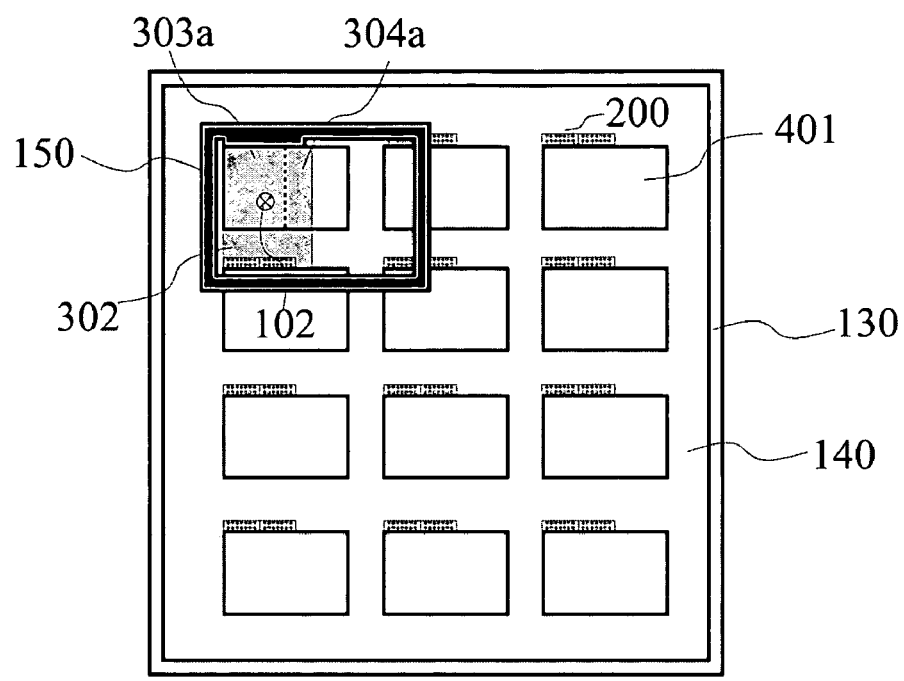
FIG. 4 shows a schematic view of the usage of the subject invention and the advantages.

FIG. 4 shows a substrate support 130 with the glass substrate 140. Displays 401 are to be tested with the above described method. Displays 401 are also too large to lie within the test range 302 of the test apparatus. Thus, displays 401 also have to be partitioned into areas 303*a* and 304*a*, which are tested independently of each other. Accordingly, a first area 303*a* and a second area 304*a* of a display 401 is marked in FIG. 4. Exemplarily, these areas correspond to a half of a display.

The contact unit 150 in FIG. 4 has the same size as the contact unit 150 in FIG. 3. Due to the different dimensions of the displays 401 as compared to the displays 301, the contact unit covers parts of a display 401 in FIG. 4. The contact unit 806 as shown in FIG. 8 cannot be adapted to the different dimensions. Thus, for a contact unit according to FIGS. 8*a* to 8*c*, it is necessary to use different types of contact units 806 (see FIG. 8) for different types of test objects.

However, the inventive contact unit 150 can be placed at different locations of the substrate. Consequently, for the present invention, the inspection procedure is not disturbed by the covering of a display, which is not tested at the time being (in FIG. 4, top middle display).

The display type 401 also has a size that is larger than the test range 302. Thus, analogously to the steps described with respect to FIG. 3, the contact unit 150 is here also displaced with the substrate 140 in a manner, that the contacting of the display 401 is possible during the testing of the first area 303*a* and the second area 304*a*.

As can be seen in FIG. 4, the contact unit 150 does not have a direct contact at all four sites of the display 401 to the display to be measured, respectively. Thus, it is advantageous for the present invention if the contact assembly 200 or several of the contact assemblies 200, by means of which the contact between the contact unit 150 and the display is established, are arranged, that the contacting also takes place at varying dimensions of the displays. In FIG. 4, all contact assemblies 200 are arranged at the top side of the respective display 401. Therefore, in this case, the contacting of the contact unit 150 is independent of the dimensions of the display.

Thus, contrary to the basic principle shown with respect to FIG. 8, the different types of displays can be tested with the present invention without exchanging or swapping the contact unit 150.

Figure 5:
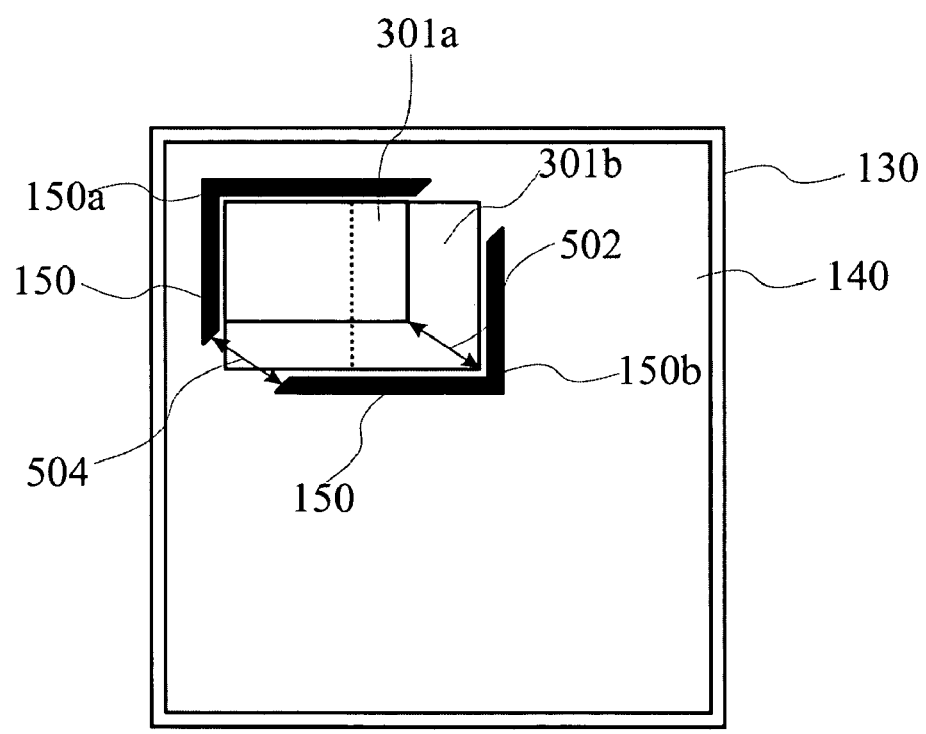
FIG. 5 shows a schematic top view of an embodiment according to the present invention.

The similar is also true for the embodiment shown in FIG. 5. Analogously to the previous figures, the embodiment described in FIG. 4, shows a substrate support 130 with a glass substrate 140. The contact unit in FIG. 5 includes a first part 150*a* and a second part 150*b*. The embodiment of the contact unit 150 in FIG. 5 has the same inventive characteristics as the contact unit in FIG. 3. That means that the contact unit in FIG. 5 can also be positioned relative to the optical axis of the test apparatus and independent of the positioning of the glass substrate.

Furthermore, the contact unit 150 in FIG. 5 gives an additionally improved flexibility by being able to vary the size of the contact unit 150. The modification of the size of the contact unit 150 in FIG. 5 is realized by a displacement of the two parts 150a and 150b, which is indicated by arrow 504.

Further, FIG. 5 shows a first display type 301a and a second display type 301b. The two display types differ by their dimensions. Arrow 502 symbolizes the difference in size between the displays 301a and 301b. As mentioned above, arrow 504 describes a modification of the size of the contact unit 150. The modification of the size can be adapted to the difference in size of the two display types 301a and 301b.

If, within FIG. 5, other displays of the type 301b are tested instead of a first display type 301a, the contact unit can be adapted to the modified display size or display form. The modification of the size 502 is compensated by a displacement 504 of the parts 150a and 150b of the contact unit.

By this preferred aspect, an even larger flexibility can be generated. For such an embodiment, an additional positioning unit for the two parts 150a and 150b relative to each other is provided. Alternatively, for both parts 150a and 150b of the contact unit 150 a separate positioning unit can be provided, respectively. Independent of a modification of the dimension of the contact unit 150 by the displacement 504 of the two parts of the contact unit 150, it is here also preferred (see explanations to FIGS. 2 and 4) if the different types of displays have identical or compatible contact assemblies 200.

The embodiments described with respect to this invention refer to contact units that are essentially formed by a rectangular frame or parts of a rectangular frame. This is preferred for the present invention since it has the advantage to carry out a contacting of the display from all four sides.

The present invention is not limited thereto. The inventive idea can also be realized with a bar shaped, several bar shaped or other contact units. For example, for the contact assembly 200 in FIG. 4, a contact bar at the top side or at another side of the display is sufficient. For a further contacting at a further side face of the display, the contact unit in the form of a corner is sufficient.

As already mentioned with respect to FIG. 5, in the event that several parts of the contact unit exist, it is preferred if several drives for positioning the part of the contact unit exist. The additional drives can either be used for the positioning of the individual parts relative to the optical axis of the test apparatus or for the positioning relative to each other.

Figure 6:
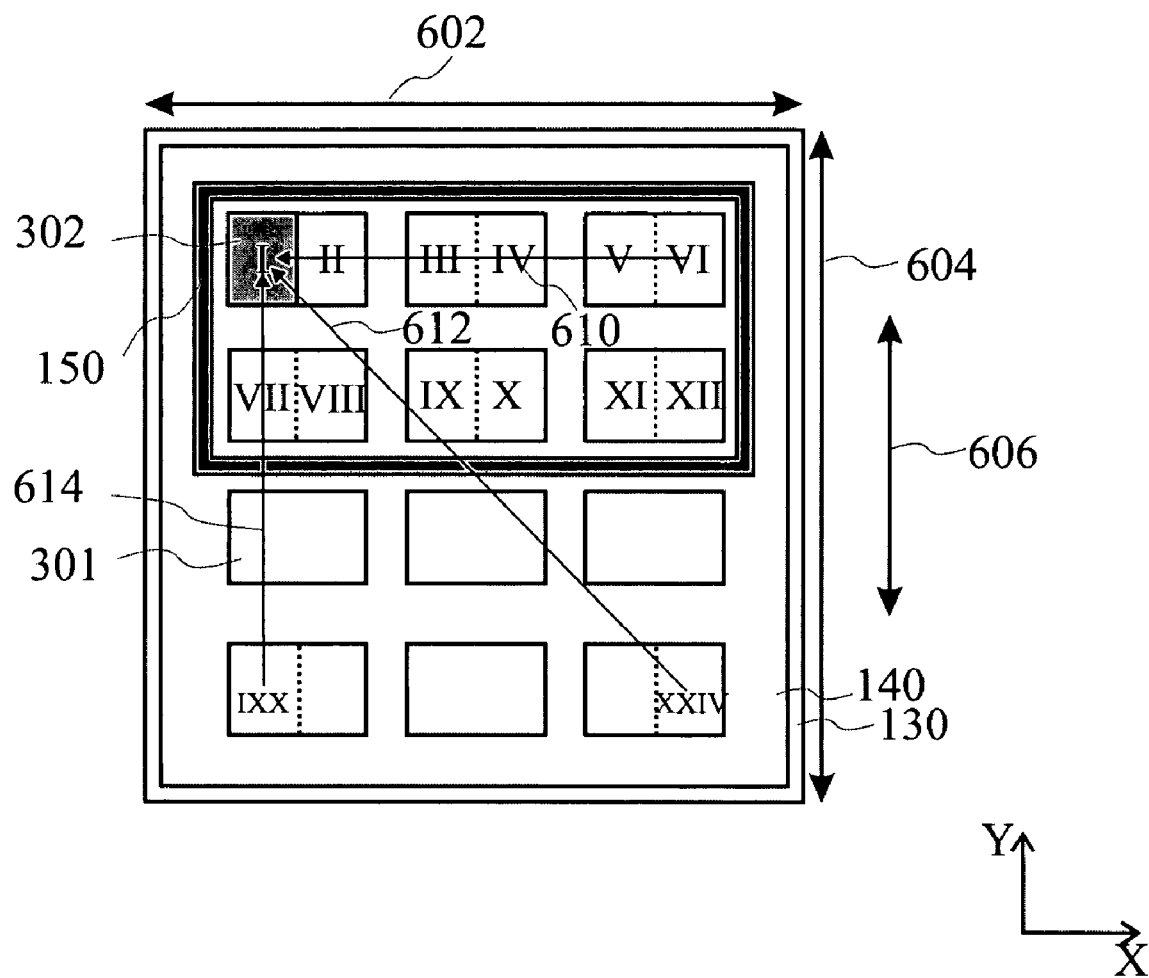
FIG. 6 shows a schematic top view of a further embodiment according to the present invention.

FIG. 6 shows a further embodiment of the present invention. Again, there is a substrate support 130 with a glass substrate 140. The displays 301 or circuits required for the displays, respectively, are arranged on the glass substrate. The test range 302 predetermined by the test apparatus is indicated gray in FIG. 6. Further, FIG. 6 shows a contact unit 150. The contact unit 150 covers six displays. Thus, FIG. 6 can be interpreted as if a test object consisting of six displays has to be tested. Consequently, the test object is so large that testing of the test object cannot be conducted by the test of two areas as in FIG. 3 (there: test object=display). In FIG. 6, in fact 12 areas are tested to obtain all test results relevant for the inspection of the entire test object.

Therefore, the first test object is partitioned in 12 areas I to XII. Each of these areas has the same size as to test range 302 of the test apparatus. The accordance of the sizes of the test range 302 and the areas I to XII is exemplarily and not limiting for the present inventive idea.

Further, the following dimensions and displacement ranges are indicated in FIG. 6, in order to refer to respective displacements during the description of the test method. The dimensions of the substrate support are denoted in x-direction with 602 and in y-direction with 604. Arrow 610 symbolizes the displacement range of the substrate in x-direction. Arrow 614 symbolizes the displacement range of the substrate 140 in y-direction. The displacement indicated by arrow 612 is an addition of the displacements 610 and 614. Additionally, a displacement of the contact unit 150 relative to the substrate support 130 is denoted by arrow 606. The individual areas of the test object are numerated with roman numbers.

In FIG. 6, the contact unit covers several displays 301. The test object consists in the present case exemplarily of six displays or of the areas I to XII, respectively. The six displays within the test object are electrically connected with each other. Thereby, signals can be sent to all displays via the contact unit or can be received from all displays, respectively.

The test range 302 of the electron beam measurement system extends only over a small part of the test object. The substrate lies on the substrate holder 130. The substrate holder has the dimensions 602 in x-direction and 604 in y-direction. In order to be able to measure all displays on the substrate, the substrate holder 130 has a displacement range in x-direction according to arrow 610. Thereby, a sufficient displacement range is given to move the area VI in the test range 302 of a test apparatus. A displacement range in y-direction according to arrow 614 approves for the measurement of the area IXX. The area XXIV of a display being within FIG. 6 most distant from the test range 302 can be inspected with the displacements 612.

The test method is based in this example as well on the principle described with respect to FIGS. 3a to 3d. At first, the area I of the test object is inspected. Afterwards, the glass substrate 140 as well as the contact unit 150 is for example moved in x-direction. The amount of the displacement is chosen so that area II can be inspected. Thereupon, area II is inspected. Thereafter, a synchronous displacement of the contact unit 150 and glass substrate 140 is conducted again. This procedure is repeated until all areas II to XII are tested.

Then, the contact unit and the substrate are moved relative to each other (see 606) in order to be able to contact the next test object (areas XIII to XXIV) with the contact unit 150. All areas are also tested within the area of this test object. Thereby, the contact unit 150 is displaced essentially parallel during a displacement of the respective areas to the test range 302.

The previous embodiments referred exemplarily to a test method with a beam of charged particles. Since these test methods are very sensitive, it is preferred not to move the test apparatus, that is the beam source, the beam shaping, the beam deflection, and the signal detection. Thereby, for example a misalignment due to vibrations can be reduced.

Figure 10:
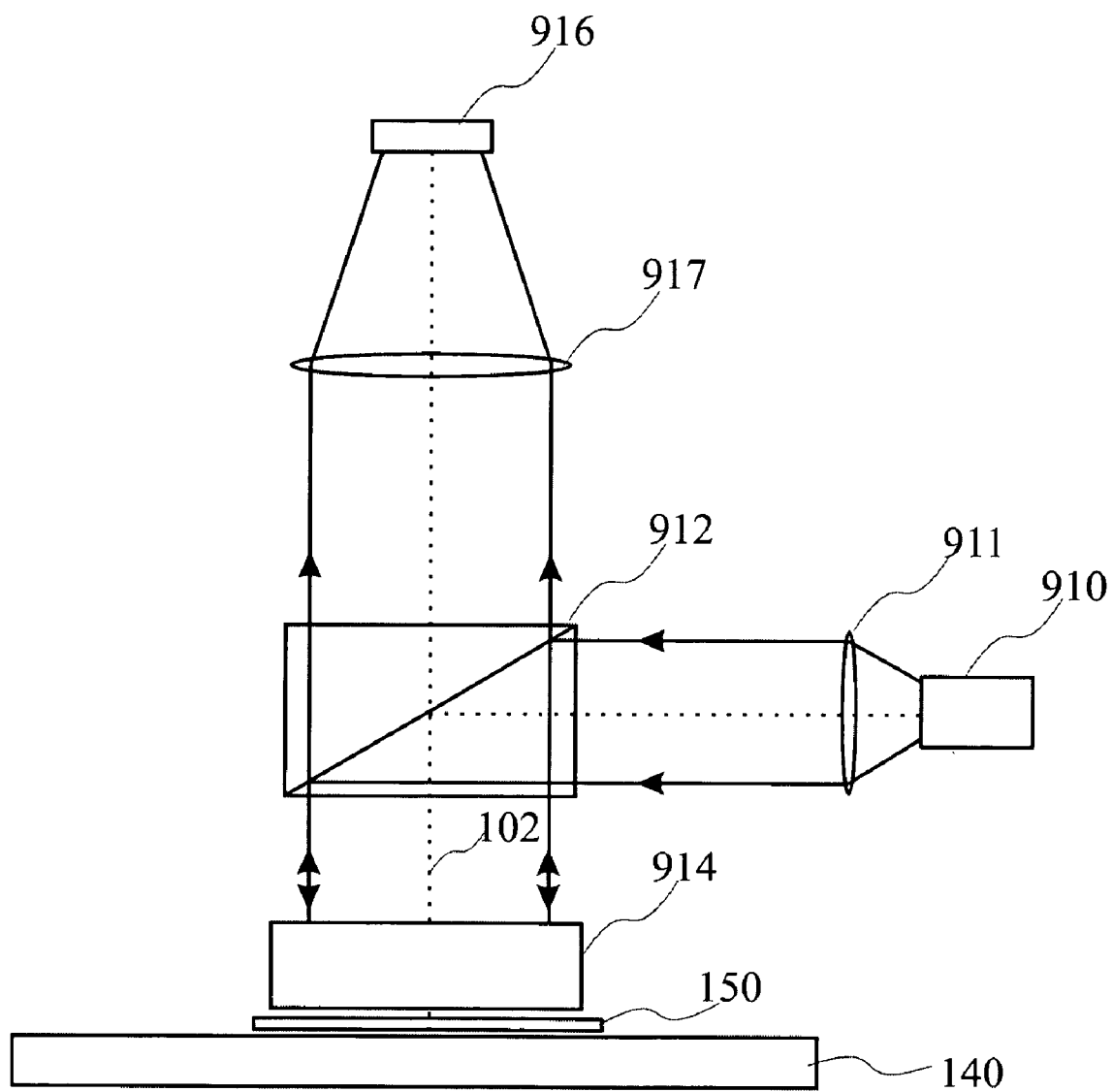
FIG. 10 shows a schematic side view of a further test system.

A further test method is described in FIG. 10, the alignment sensitivity of which is less. Therefore, also the optical axis of the test apparatus can be displaced in the following example. FIG. 10 shows a beam source in the form of a lamp 910 with a beam shaping optics 911. The parallel light beams are guided via a beam divider 912 in the direction of the surface of the substrate 140. The test objects for example in the form of displays are arranged on the substrate. The beam is reflected within the measurement head 914. Additionally, there is a modulator within the measurement head 914, which is capacitively coupled with the display to be tested. The modulator varies its local transmission characteristics depending on the capacitive coupling to the individual pixels of the display. The light beam, which propagates along the optical axis 102, is influenced by the varied transmission characteristics. The local variations of the light beam corresponding to an individual pixels are measured by having the light beam, which is reflected at the measurement head 914, passing through the beam divider and being imaged on the detection camera 916 with the optical system 917.

A further aspect of the present invention results, since for the test method described with respect to FIG. 10 the optical axis 102 can be moved relative to the substrate with relatively few complications. This aspect is described in the following considering the embodiment according to FIGS. 11a to 11d. Thereby, an analogous inventive method for contacting and testing of displays is concerned. For the previously described embodiments, the holder 130 with the substrate 140 was displaced. Since the holder has, as compared to other components, a large surface, it is necessary to provide a large floor space for the entire system in order to move the holder. Thus, space can be saved if the optical axis of the test apparatus and thereby the measurement range 302 is displaced instead of the holder with the substrate. For very sensitive measurement apparatuses, as for example electron beam measurement apparatuses, this is only limitedly possible. For this reason, this aspect of the present invention is described with respect to an embodiment with a light optical measurement system analogously to FIG. 10.

Figure 11A:
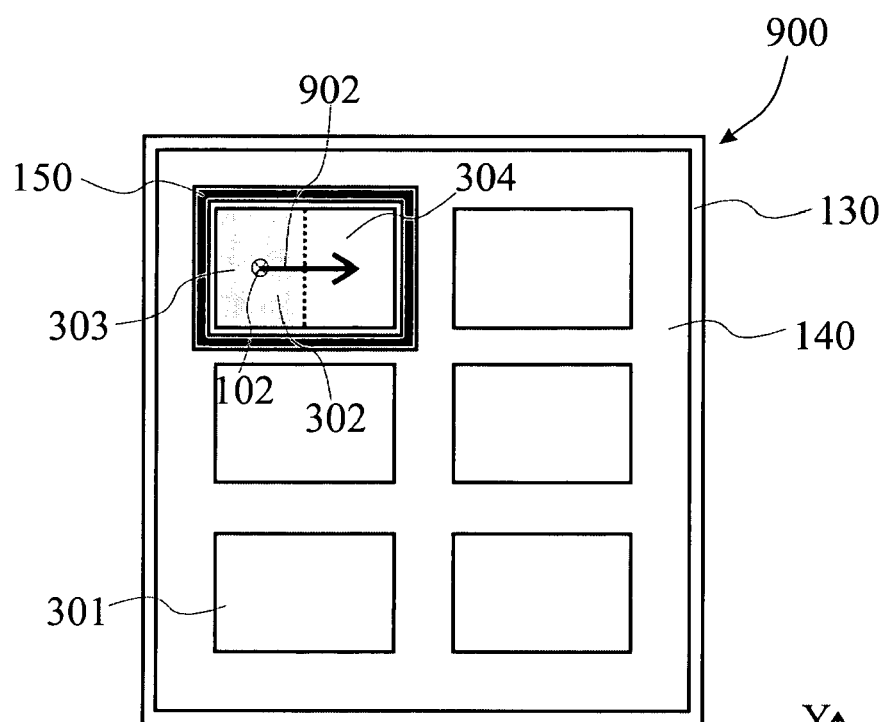
FIGS. 11a to 11d show schematic top views on a substrate with several test objects on a holder and the usage of the contact unit according to a further aspect of the present invention.

Within FIG. 11a, the sample support 130 with the glass substrate 140 is shown. The sample support is quasi fixed during the test activity. In FIG. 11a, a constellation is shown, whereby at first a first area 303 of the display is tested. Therefore, amongst others, a test apparatus or the optical axis 102 thereof, respectively, is positioned so that the test range 302, which is indicated gray, covers at least the first area 303 of the first display to be tested. For a light optical method, the entire test range can for example be tested with the quasi-parallel photon beam. Thereby, the measurement apparatus directly above the display to be tested comprises an optical modulator, which reacts on the pixel characteristics of the display via a capacitive coupling. The optical modulator changes that transmission characteristics for the parallel photon beams. Thus, an image of the photon beam onto a camera results in measurement result that can be evaluated.

Additionally to the positioning of the measurement apparatus with the test range 302, the contact unit 150 is also positioned. The contact unit serves amongst others for the capacitive coupling between the pixels of the display to be tested and the optical modulator of the measurement head 914 of the test apparatus (see FIG. 10). The display can for example be supplied with signals by the contacting of the contact unit, whereby a test of the first area of the first display 301 to be tested can be conducted.

Figure 11B:
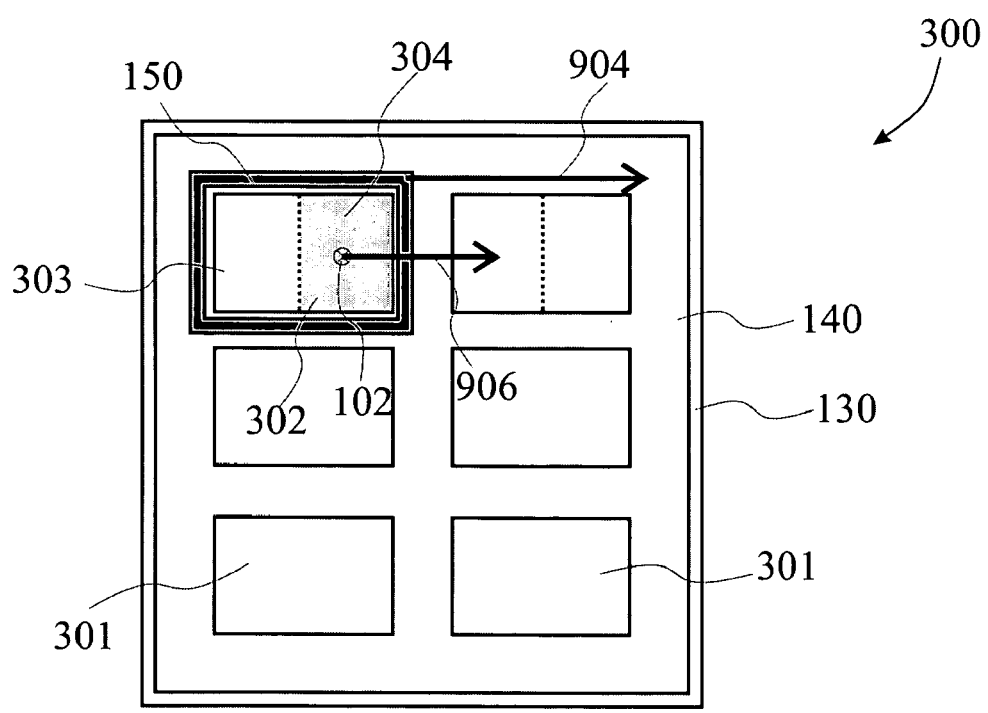

The test of the second area 304 of the first display 301 to be tested is conducted by a relative positioning of the components as shown in FIG. 11b. Therefore, the optical axis of the test apparatus and thereby the test range 302 is displaced as indicated by the arrow 902 in FIG. 11a.

Figure 11C:
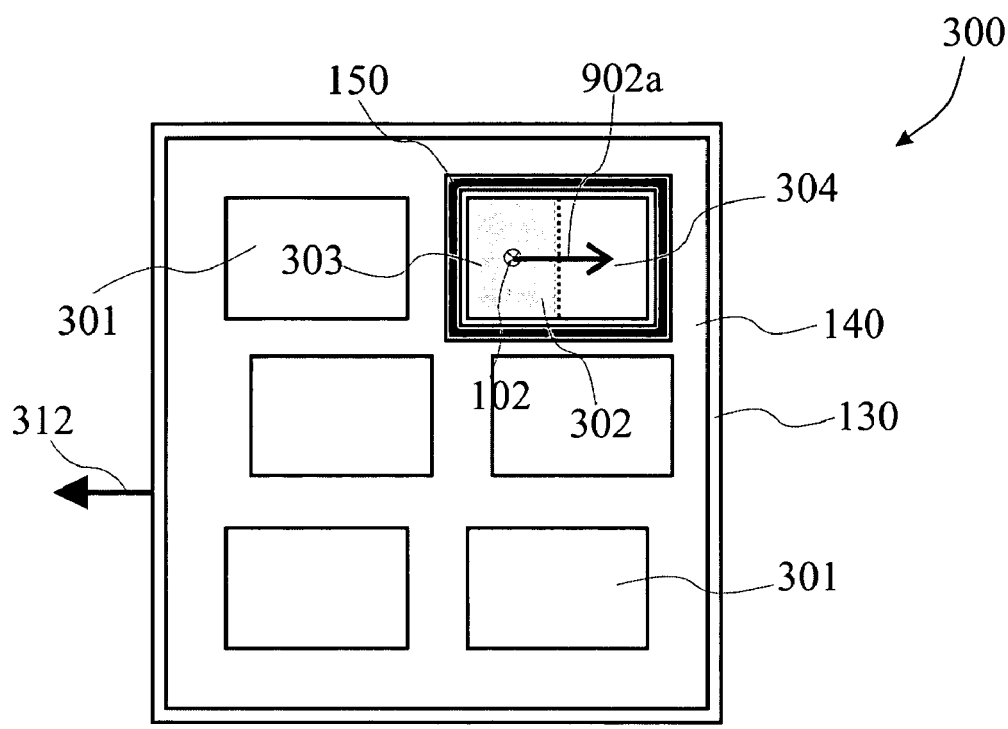

After the testing of the second area 304 of the first display to be tested (see FIG. 11b), the contact unit 150 is displaced as indicated by arrow 904. Further, the optical axis of the test apparatus is displaced according to arrow 906. Thereby, the positioning of the components relative to each other, which is shown in FIG. 11c, is achieved. According to FIG. 11c, a first area 303 of a further display to be tested is positioned within the test range of the test apparatus. After the test of this area, the optical axis of the test apparatus is displaced according to arrow 902a. Since all displays 301 are identical within the present embodiment, the amount and the direction of the displacement 902a corresponds to the displacement 902 (see FIG. 11a).

Figure 11D:
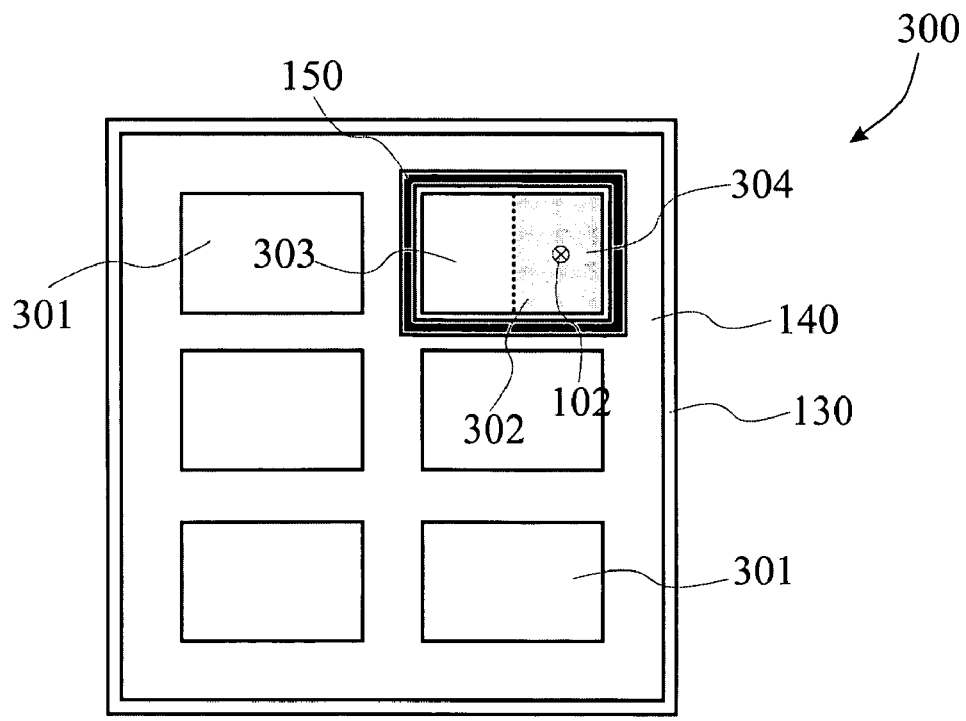

After the displacement 902 of the test apparatus and thus the test range 302, the positioning of the components relative to each other as shown in FIG. 11d is given. Thereby, the second area 304 of the further display to be tested lies within the test range 302 (marked gray) of the test apparatus. The second area of the further display can now be tested.

All displays or all areas of all displays, respectively, can be tested by further displacements of the contact unit and the optical axis of the test apparatus relative to the holder 130 or the glass substrate 140, respectively.

According to the embodiments described with respect to the present invention, a large flexibility is given which makes an exchange of contact units unnecessary. Furthermore, the displays increasing in size can be contacted by means of simply realized contact units, since the contact unit can follow the displacement of the test objects and the optical axis of the corpuscular beam apparatus relative to each other.

While the foregoing is directed to embodiments of the present invention, other and further embodiments of the invention may be devised without departing from the basic scope thereof, and the scope thereof is determined by the claims that follow.

The invention claimed is:

1. A method for testing of a substrate with several test objects with a test apparatus having a holder for the substrate, a displacement unit for the holder with a holder displacement range in x-direction and a holder displacement range in y-direction, and a contact unit for contacting of the at least one test object, whereby the contact unit has a displacement range in x-direction and/or in y-direction, and the contact unit displacement range in x-direction and/or the contact unit displacement range in y-direction are smaller than the respective holder displacement range, comprising the following steps:
   putting the substrate on the holder;
   contacting of a first test object with the contact unit, wherein the contact unit has essentially maximal the dimension of half of the holder dimension in one direction perpendicular to the optical axis;
   positioning of the substrate so that a first area of the first test object lies in a test range of the test apparatus;
   testing of the first area of the test object;
   displacing the substrate so that at least a further area of the first test object lies in the test range of the test apparatus;
   displacing the contact unit so that the position of the contact unit is essentially unchanged with respect to the first test object;
   testing of the further area of the test object; and
   displacing the contact unit and the substrate relative to each other so that a further test object can be contacted.

2. The method of claim 1, wherein the contact unit is displaced by tracking.

3. The method of claim 1, wherein the contact unit is displaced by carrying along.

4. The method of claim 1, wherein the contact unit is displaced as long as a contact to the substrate is present.

5. The method of claim 1, wherein the test range is scanned by a beam deflection of a corpuscular beam in two directions.

6. The method of claim 1, wherein the test range is scanned by a beam deflection of a corpuscular beam in one direction and a substrate movement in another direction.

7. The method of claim 1, wherein the contact unit is displaced as long as no contact to the substrate is present.

8. The method of claim 1, wherein the contact unit is adapted to different forms of test objects.

9. The method of claim 1, wherein the testing is conducted by scanning of the test range with a corpuscular beam and measurement of the second area electrons.

10. The method of claim 1, wherein the testing is conducted by scanning of the test range with a corpuscular beam and measurement of a signal fed through the contact unit.

11. The method of claim 1, wherein before the testing a vacuum of smaller than $1*10^{-3}$ mbar is generated.

* * * * *

UNITED STATES PATENT AND TRADEMARK OFFICE
CERTIFICATE OF CORRECTION

PATENT NO. : 7,135,875 B2 Page 1 of 1
APPLICATION NO. : 10/716102
DATED : November 14, 2006
INVENTOR(S) : Brunner It is certified that error appears in the above-identified patent and that said Letters Patent is hereby corrected as shown below:

Column 3, Line 51: Change "large" to --larger--

Column 6, Line 66: Change "or" to --are--

Signed and Sealed this

Thirteenth Day of March, 2007

JON W. DUDAS
*Director of the United States Patent and Trademark Office*